(12) United States Patent  
Krvavac

(10) Patent No.: US 7,521,995 B1  
(45) Date of Patent: Apr. 21, 2009

(54) INVERTED DOHERTY AMPLIFIER WITH INCREASED OFF-STATE IMPEDENCE

(75) Inventor: Enver Krvavac, Lake Zurich, IL (US)

(73) Assignee: Motorola, Inc., Schaumburg, IL (US)

( * ) Notice: Subject to any disclaimer, the term of this patent is extended or adjusted under 35 U.S.C. 154(b) by 19 days.

(21) Appl. No.: 11/863,429

(22) Filed: Sep. 28, 2007

(51) Int. Cl.
 *H03F 3/68* (2006.01)
(52) U.S. Cl. .................. 330/124 R; 330/53; 330/295; 330/302
(58) Field of Classification Search .......... 330/124 R, 330/53, 295, 302
See application file for complete search history.

(56) References Cited

U.S. PATENT DOCUMENTS

| | | | |
|---|---|---|---|
| 5,420,541 A * | 5/1995 | Upton et al. | 330/286 |
| 5,568,086 A * | 10/1996 | Schuss et al. | 330/124 R |
| 6,262,629 B1 * | 7/2001 | Stengel et al. | 330/124 R |
| 6,320,462 B1 * | 11/2001 | Alley | 330/124 R |
| 6,791,417 B2 * | 9/2004 | Pengelly et al. | 330/295 |
| 7,345,537 B2 * | 3/2008 | Apel et al. | 330/134 |

OTHER PUBLICATIONS

Ogawa, et al. "High Efficiency Feed-Forward Amplifier Using RF Predistortion Linearizer and the Modified Doherty Amplifier", 2004 IEEE MTT-S Digest.

* cited by examiner

*Primary Examiner*—Patricia Nguyen
(74) *Attorney, Agent, or Firm*—Valerie M. Davis

(57) ABSTRACT

An amplifier that amplifies an input signal and provides the amplified signal to a load at a summing junction that has a first impedance value. The amplifier includes a splitter network receiving the input signal and providing a phase delayed signal and an undelayed signal; a carrier amplifier path amplifying the phase delayed signal and including a carrier amplifier and a first output match network coupled between the carrier amplifier and the summing node; and a peaking amplifier path amplifying the undelayed signal and including a peaking amplifier, a second output match network coupled to the peaking amplifier, and a phase delay element coupled between the second output match network and the summing node, wherein the phase delay element provides a degree of phase delay and has a designed characteristic impedance value that is larger than the first impedance value for increasing the off-state impedance of the peaking amplifier.

9 Claims, 1 Drawing Sheet

US 7,521,995 B1

INVERTED DOHERTY AMPLIFIER WITH INCREASED OFF-STATE IMPEDENCE

TECHNICAL FIELD

The technical field relates generally to power amplifiers and more particularly to an inverted Doherty amplifier configuration providing increased off-state impedance.

BACKGROUND

Some electronic systems such as base transceiver stations ("BTS") are designed using a Doherty type linear amplifier configuration for increased linearity and efficiency in a linear amplifier topology. In general, the Doherty amplifier uses at least two amplifier paths, a carrier amplifier path and a peaking amplifier path, and combines the output of these two paths at a summing junction (or node) in such a way as to provide for the increased linearity and efficiency. In the traditional Doherty amplifier topology, a carrier amplifier receives an undelayed input signal for amplification, and a peaking amplifier receives a phase delayed input signal for amplification. More recently, electronic systems such as BTSs and mobile devices are designed using a so called "inverted" Doherty amplifier configuration. In this Doherty type configuration, the carrier amplifier receives the delayed input signal for amplification, and the peaking amplifier receives the undelayed input signal for amplification.

One parameter of a Doherty type amplifier that can affect linearity and operational efficiency of the amplifier is peaking amplifier off-state impedance. More particularly, the peaking amplifier off-state impedance is the impedance looking back into the peaking amplifier, including the output match, while the peaking amplifier is in an OFF state. Peaking amplifier off-state impedance should be relatively high so as not to load the carrier amplifier during a low $RF_{IN}$ drive condition when the peaking amplifier is off. Known Doherty type amplifier topologies maintain a high enough peaking amplifier off-state impedance for some applications, but not for others. For example, due to a lower than desired peaking amplifier off-state impedance, efficiency and linearity are compromised for applications utilizing a Doherty amplifier configuration that includes laterally diffused metal oxide field effect transistors as the carrier and peaking amplifiers and that operate at higher frequencies (e.g., around 2 GHz).

Thus, there exists a need for a Doherty type linear amplifier configuration that addresses at least some of the shortcomings of some known Doherty type amplifier configurations.

BRIEF DESCRIPTION OF THE FIGURE

The accompanying figure, which together with the detailed description below are incorporated in and form part of the specification and serve to further illustrate various embodiments of concepts that include the claimed invention, and to explain various principles and advantages of those embodiments.

Figure 1:
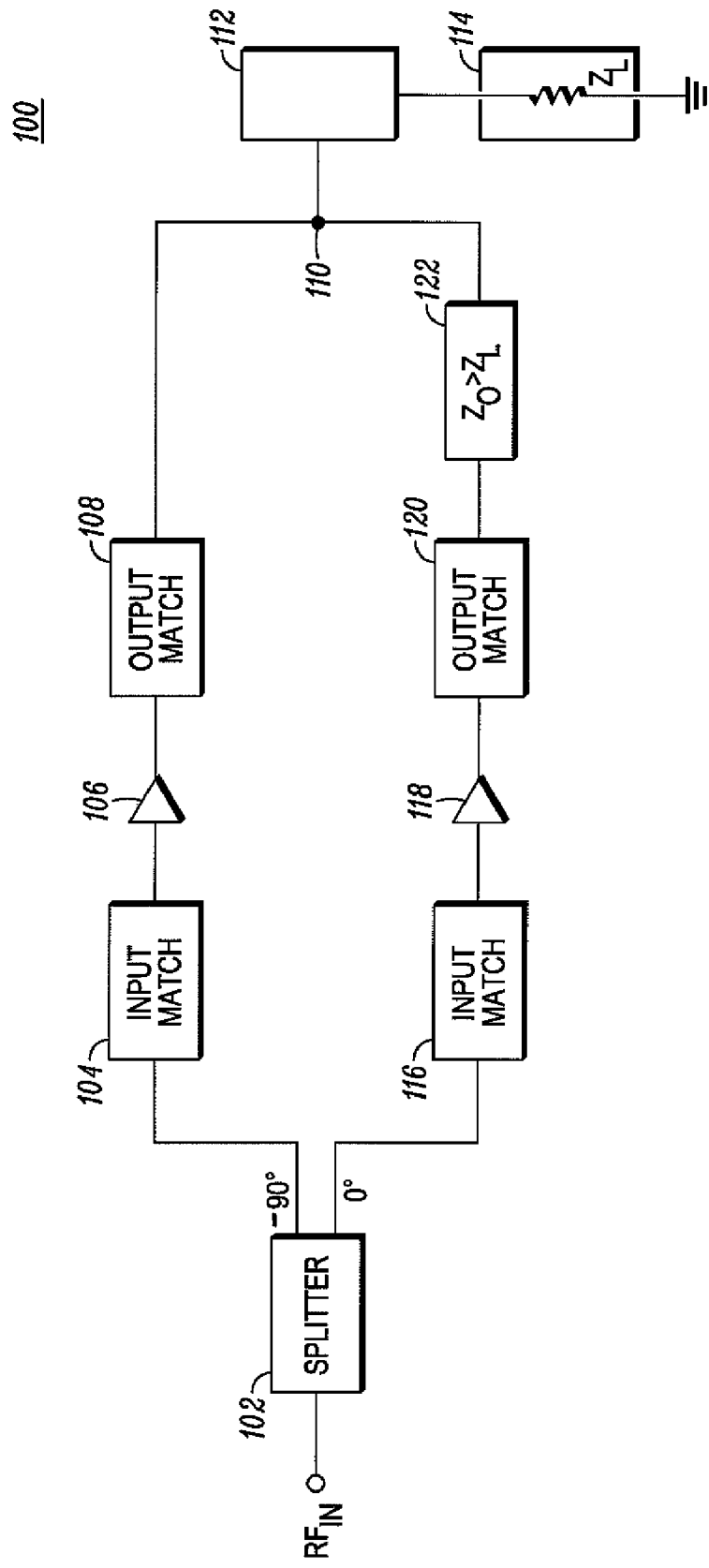
FIG. 1 is a block diagram of a Doherty type amplifier in accordance with some embodiments.

Skilled artisans will appreciate that elements in the figure are illustrated for simplicity and clarity and have not necessarily been drawn to scale. For example, the dimensions of some of the elements in the figure may be exaggerated relative to other elements to help improve understanding of various embodiments. In addition, the description and drawing do not necessarily require the order illustrated. Apparatus and method components have been represented where appropriate by conventional symbols in the drawing, showing only those specific details that are pertinent to understanding the various embodiments so as not to obscure the disclosure with details that will be readily apparent to those of ordinary skill in the art having the benefit of the description herein. Thus, it will be appreciated that for simplicity and clarity of illustration, common and well-understood elements that are useful or necessary in a commercially feasible embodiment may not be depicted in order to facilitate a less obstructed view of these various embodiments.

DETAILED DESCRIPTION

Generally speaking, pursuant to the various embodiments, an inverted Doherty amplifier configuration provides for improved peaking amplifier off-state impedance over known conventional and inverted Doherty amplifier configurations. In an embodiment, a phase delay element that is coupled in the peaking amplifier path between an output match network and a summing node provides a degree of phase delay and has a designed characteristic impedance value that is larger than the impedance value of a load coupled to the summing node. Designing the amplifier in this manner with the phase delay element having a characteristic impedance that is larger than the load impedance effectively increases the off-state impedance of the peaking amplifier.

This novel inverted Doherty amplifier configuration provides for improved linearity and efficiency by decreasing the load on the carrier amplifier when the peaking amplifier is in an OFF state. Another advantage is an improved phase difference between the peaking amplifier and the carrier amplifier, whereby, a wider bandwidth is achieved. Yet another advantage is that this novel Doherty configuration enables further tuning optimization because the load line for the peaking and carrier amplifiers can be optimized. Those skilled in the art will realize that the above recognized advantages and other advantages described herein are merely illustrative and are not meant to be a complete rendering of all of the advantages of the various embodiments.

Referring now to FIG. 1, there is shown a block schematic diagram of an inverted Doherty amplifier 100 in accordance with some embodiments. Amplifier 100 may be used as part of a BTS or a mobile device, for example. Inverted Doherty amplifier 100 comprises a splitter network 102 that receives an input signal ($RF_{IN}$) and provides therefrom a phase delayed signal and an undelayed signal, respectively, to a first amplifier path (the top path) and a second amplifier path (the bottom path). The first amplifier path comprises an input match network 104, an amplifier network 106 and an output match network 108. The second amplifier path comprises an input match network 116, an amplifier network 118 and an output match network 120. The first and second amplifiers paths each amplify their respective signals, wherein the amplified signals are combined into a combined signal by a combiner network, which includes an impedance transforming element 112 and a phase delay element 122. The combined signal is combined at a summing node 110 and is provided via the impedance transforming element 112 to a load 114 having a real impedance of $Z_L$.

In operation in an embodiment, amplifier network 100 receives $RF_{IN}$ (typically a linear modulated radio frequency (RF) signal) at the splitter 102, which splits the input signal into at least two parts that are provided to separate paths, such as a carrier amplifier path (the top path) and a peaking amplifier path (the bottom path). In an embodiment, the splitter is a hybrid coupler that phase shifts one of the resulting two signals by −90 degrees (termed herein a delayed signal) with respect to the other signal (termed herein an undelayed signal). In this embodiment, the splitter network 102 comprises a single piece of hardware that provides for all of the necessary phase delay at the input of the Doherty amplifier 100 (i.e., prior to amplifier networks 106, 118). However, other embodiments are envisioned and contemplated within the scope of the teachings herein, wherein the splitter network comprises a splitter device that provides a portion of the phase delay and one or more separate phase delay elements in the first and/or second amplifier paths before the amplifier networks 106, 118 that provide the remaining portion of phase delay required at the input. It should be noted that in any such embodiment, the total phase delay at the input is substantially equal to the phase delay provide by the phase delay element 122.

The signals are provided, respectively, to the input match networks 104, 116 and then to the amplifier networks 106, 118, such that the carrier amplifier path receives the delayed signal and the peaking amplifier path receives the undelayed signal. Each amplifier network 106, 118 comprises a single amplifier, which in an embodiment is a laterally diffused metal oxide field effect transistor (or LDMOS FET as is referred to in the art). In other embodiments, a different type of transistor can be used and/or two or more suitable transistors in cascade may be used depending on the particular implementation and design requirements. Amplifier 106 operates in a linear mode and conducts between 180° to 360° of the input signal, and amplifier 118 conducts when the input signal is above a pre-selected threshold. In the vernacular of the art, amplifier 106 is referred to as a carrier amplifier and amplifier 118 is referred to as a peaking amplifier. The outputs of the amplifiers 106, 118 are provided, respectively, to output match networks 108, 120.

The combiner network is used to combine the outputs of the carrier amplifier 106 and the peaking amplifier 118, and includes the impedance transforming element 112 and phase delay element 122, which in this embodiment are each quarter wavelength (or "quarter wave") elements. The quarter wave elements 112 and 122 are arranged such that the output of the carrier amplifier 106 is provided to the summing node 110, and the output of the peaking amplifier 118 is first phase shifted and then provided to the summing node 110 to generate a summed signal from the two amplifier paths.

Finally, the summed signal is provided to the load 114 through the quarter wavelength element 112. It will be appreciated by those skilled in the art that, although referred to as quarter wave elements, since it is intended that the amplifier system amplify signals over a given range of frequencies, the quarter wave elements are substantially quarter wave elements, but not necessarily an exact quarter wave element. Moreover, variations in the processing of the quarter wave element may lead to phase shifting of signals amount that is not exactly the amount desired. Furthermore, it will be appreciated by those skilled in the art that the function of any quarter wave elements may be implemented with lumped components such as inductors and capacitors instead of with transmission lines as in this described embodiment.

As in the prior art, the quarter wave element 112 is disposed between the summing node and the load. This quarter wave element 112 has a characteristic impedance lower than the real impedance (resistance) of the load of $R_L$. The characteristic impedance (e.g., of a transmission line) is the ratio of amplitudes of a single pair of voltage and current waves propagating along the line in the absence of reflections. The phase delay element 122 has a dual role. First, it provides a high impedance path when the peaking amplifier is not conducting so as not to load the summing node and carrier amplifier while it is off. Second, it provides phase correction (of substantially 90 degrees) for the signal in the peaking amplifier path such that, at the summing node, the signal from the carrier amplifier path and the peaking amplifier path(s) are substantially in phase and can, thereby, be properly combined. Practically speaking, since it is contemplated that the amplifier network will be used over a limited frequency range, there may be small phase differences, but not such that the substantial benefit of the invention is lost.

It is taught in the prior art that the quarter wavelength element 122 has a characteristic impedance that is substantially equal to the real impedance of the load, in order to achieve various stated benefits. However, in accordance with the teachings herein (and contrary to conventional Doherty amplifier configurations), the phase delay element 122 is designed to have a characteristic impedance $Z_O$ that is greater than $Z_L$ in order to increase the peaking amplifier off-state impedance. In an embodiment, to facilitate peaking amplifier off-state impedance optimization using the teachings herein, output match network 120 is also configured and optimized based on the designed characteristic impedance of the phase delay element 122. This further eliminates the need for additional transmission line elements in either the carrier amplifier path or the peaking amplifier path.

In one illustrative implementation, let $Z_L$ be substantially 50 Ohms. In such a case, it has been found that for a device operating at around 2.0 GHz, $Z_O$ can be designed to be substantially 75 Ohms. For such a scenario, the peaking amplifier off-state impedance is shown to be doubled compared to when the characteristic impedance of phase delay element 122 is substantially equal to the impedance of the load. Moreover, for the condition as described above of $Z_O > Z_L$, substantial efficiency and linearity improvement can be realized over the Doherty configuration having a condition of $Z_O = Z_L$. Another benefit that was evident but not expected was that the phase differential between the carrier and peaking amplifier paths was improved during the peaking amplifier ON state or high $RF_{IN}$ drive condition, which led to a broader Doherty design over frequency (i.e., a wider bandwidth of operation of the amplifier network). A further added benefit is that modifying the delay line impedance provides an additional degree of freedom in tuning in the increasingly complex Doherty amplifier designs.

In the foregoing specification, specific embodiments have been described. However, one of ordinary skill in the art appreciates that various modifications and changes can be made without departing from the scope of the invention as set forth in the claims below. For example, the phase delay element 122 could provide a phase delay of greater than or less than a 90 degree phase delay to generate the required peaking amplifier off-state impedance. For such embodiments, additional phase delay elements or delay lines can be placed before the carrier and/or peaking amplifies to achieve optimal phase balance in the Doherty architecture. Accordingly, the specification and figures are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. Moreover, substantially is defined as a range based on manufacturing variations and variations over time and temperature. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A power amplifier for amplifying an input signal and providing an amplified signal to a load at a summing node, wherein the load has a first impedance value, the power amplifier comprising:
   a splitter network receiving the input signal and providing a phase delayed signal and an undelayed signal, wherein the phase delayed signal is delayed by substantially a first predetermined degree of phase delay with respect to the undelayed signal;
   a carrier amplifier path amplifying the phase delayed signal and comprising a carrier amplifier and a first output match network coupled between the carrier amplifier and the summing node; and
   a peaking amplifier path amplifying the undelayed signal and comprising a peaking amplifier, a second output match network coupled to the peaking amplifier, and a phase delay element coupled between the second output match network and the summing node, wherein the phase delay element provides substantially the first predetermined degree of phase delay and has a designed characteristic impedance value that is larger than the first impedance value for increasing the off-state impedance of the peaking amplifier based on the designed characteristic impedance value, when the peaking amplifier is off.

2. The power amplifier of claim 1, wherein the first impedance value is substantially 50 Ohms and the designed characteristic impedance value of the phase delay element is greater than 50 Ohms.

3. The power amplifier of claim 2, wherein the designed characteristic impedance value of the phase delay element is substantially 75 Ohms.

4. The power amplifier of claim 1, wherein the carrier amplifier and the peaking amplifier each comprise a laterally diffused metal oxide field effect transistor.

5. The power amplifier of claim 1, wherein the power amplifier is included in at least one of a base transceiver station and a mobile device.

6. The power amplifier of claim 1, wherein the second output match network is configured based on the designed characteristic impedance value of the phase delay element.

7. The method of claim 1, wherein the phase delay element is substantially a quarter wavelength element.

8. The method of claim 1, wherein the first predetermined degree of phase delay is 90 degrees of phase delay.

9. A power amplifier for amplifying an input signal and providing an amplified signal to a load at a summing node, wherein the load has a first impedance value, the power amplifier comprising:
   a splitter network receiving the input signal and providing a phase delayed signal and an undelayed signal, wherein the phase delayed signal is delayed by substantially 90 degrees with respect to the undelayed signal;
   a carrier amplifier path amplifying the phase delayed signal and comprising a carrier amplifier and a first output match network coupled between the carrier amplifier and the summing node; and
   a peaking amplifier path amplifying the undelayed signal and comprising a peaking amplifier, a second output match network coupled to the peaking amplifier, and a phase delay element coupled between the second output match network and the summing node, wherein the phase delay element provides substantially 90 degrees of phase delay and has a designed characteristic impedance value that is larger than the first impedance value for increasing the off-state impedance of the peaking amplifier based on the designed characteristic impedance value, when the peaking amplifier is off.

* * * * *